US011283227B2

(12) United States Patent
Chapel et al.

(10) Patent No.: US 11,283,227 B2
(45) Date of Patent: *Mar. 22, 2022

(54) DATA CENTER NETWORK DISTRIBUTION SYSTEM

(71) Applicant: Zonit Structured Solutions, LLC, Boulder, CO (US)

(72) Inventors: Steve Chapel, Iliff, CO (US); William Pachoud, Boulder, CO (US)

(73) Assignee: Zonit Structured Solutions, LLC, Boulder, CO (US)

( * ) Notice: Subject to any disclaimer, the term of this patent is extended or adjusted under 35 U.S.C. 154(b) by 952 days.

This patent is subject to a terminal disclaimer.

(21) Appl. No.: 15/673,153

(22) Filed: Aug. 9, 2017

(65) Prior Publication Data

US 2018/0375268 A1 Dec. 27, 2018

Related U.S. Application Data

(63) Continuation of application No. 14/470,691, filed on Aug. 27, 2014, now abandoned, which is a
(Continued)

(51) Int. Cl.
*H01R 25/00* (2006.01)
*H05K 7/14* (2006.01)

(52) U.S. Cl.
CPC ......... *H01R 25/006* (2013.01); *H05K 7/1492* (2013.01); *H01R 2201/04* (2013.01)

(58) Field of Classification Search
CPC . H01R 25/006; H01R 2201/04; H05K 7/1492
See application file for complete search history.

(56) References Cited

U.S. PATENT DOCUMENTS 4,361,832 A * 11/1982 Cole ...................... G08B 26/00
340/505
6,919,816 B2 * 7/2005 Dearborn .............. G06F 11/326
340/815.45
(Continued)

FOREIGN PATENT DOCUMENTS

| WO | 2006034443 A1 | 3/2006 |
| WO | 2006063023 A1 | 6/2006 |
| WO | 2008113054 A2 | 9/2008 |

OTHER PUBLICATIONS

Indian Office Action, dated Sep. 12, 2017, for Application 3275/DELNP/2012.

*Primary Examiner* — Tho D Ta
(74) *Attorney, Agent, or Firm* — Davis Graham & Stubbs LLP

(57) ABSTRACT

A method and apparatus ("utility") for facilitating connection of rack-mounted data devices (50) to a data network is provided. The utility includes a distribution strip (42) and a number of network ports (44), disposed on the distribution strip (42), for use in connecting the rack-mounted data devices (50) to the network. The distribution strip (42) has a longitudinal axis, and is disposed on a rack (40) such that a length of the distribution strip (42), defined relative to the longitudinal axis, extends primarily or exclusively along a vertical axis of the rack (40). The distribution strip may further include a data network switch device. A utility is also provided that provides improved redundancy with regard to connections of rack-mounted data devices by including a distribution strip (42) that includes first and second ports (46) for connecting the distribution strip (42) to a network device (56).

24 Claims, 10 Drawing Sheets

Related U.S. Application Data continuation-in-part of application No. 12/569,609, filed on Sep. 29, 2009, now Pat. No. 8,848,722, which is a continuation-in-part of application No. 12/531,240, filed as application No. PCT/US2008/057154 on Mar. 14, 2008, now abandoned, said application No. 12/569,609 is a continuation-in-part of application No. PCT/US2009/038427, filed on Mar. 26, 2009.

(60) Provisional application No. 60/894,850, filed on Mar. 14, 2007, provisional application No. 61/039,716, filed on Mar. 26, 2008.

(56) References Cited

U.S. PATENT DOCUMENTS

| | | | | |
|---|---|---|---|---|
| 7,911,940 B2* | 3/2011 | Shei | ............... | H04L 69/40 |
| | | | | 370/219 |
| 8,848,722 B2* | 9/2014 | Chapel | ............... | H05K 7/1492 |
| | | | | 370/401 |
| 2004/0042191 A1* | 3/2004 | Gilliland | ............... | G06F 13/409 |
| | | | | 361/796 |
| 2004/0264112 A1* | 12/2004 | Koehler | ............... | H05K 7/1457 |
| | | | | 361/600 |
| 2006/0117085 A1* | 6/2006 | Nagao | ............... | G06F 1/16 |
| | | | | 709/203 |
| 2007/0076635 A1* | 4/2007 | Tallet | ............... | H04L 12/462 |
| | | | | 370/255 |

\* cited by examiner

DATA CENTER NETWORK DISTRIBUTION SYSTEM

CROSS-REFERENCE TO RELATED APPLICATION

This application is a continuation of U.S. patent application Ser. No. 14/470,691 entitled, "DATA CENTER NETWORK DISTRIBUTION SYSTEM," filed on Aug. 27, 2014, which is a continuation of U.S. patent application Ser. No. 12/569,609 entitled, "DATA CENTER NETWORK DISTRIBUTION SYSTEM," filed on Sep. 29, 2009, which is a continuation-in-part of U.S. patent application Ser. No. 12/531,240, entitled, "DATA CENTER NETWORK DISTRIBUTION SYSTEM," filed on Mar. 14, 2008, which is the U.S. Nation Phase of PCT Application PCT/US2008/57154, entitled, "DATA CENTER NETWORK DISTRIBUTION SYSTEM," filed on Mar. 14, 2008, which in turns claims priority from U.S. Provisional Application No. 60/894,850, entitled: "DATA CENTER NETWORK DISTRIBUTION SYSTEM," filed on Mar. 14, 2007. U.S. patent application Ser. No. 12/569,609 is also a continuation-in-part and claims priority from PCT Application PCT/US2009/038427, entitled, "POWER DISTRIBUTION SYSTEM AND METHODOLOGY," filed on Mar. 26, 2009, which in turn claims priority form U.S. Provisional Application Ser. No. 61/039,716, entitled, "POWER DISTRIBUTION METHODOLOGY," filed on Mar. 26, 2008. The contents of all of the above-noted applications are incorporated herein by reference as if set forth in full and priority to these applications is claimed to the full extent allowable under U.S. law and regulations.

BACKGROUND

Data centers are generally buildings that house large numbers of file servers, data processors, network switches, or other heat-generating computer components. Typically, the interior of a data center is filled with multiple rows of two or four post racks that hold electronic data processing (EDP) equipment that are arranged in parallel relation to one another throughout the data center. An aisle for service personnel may be provided between each row of racks and at ends of the rows. Each rack may house multiple, vertically spaced computer components. In this manner, a very large number of components may be placed in a data center.

The heat collectively generated by very large numbers of densely packed components within a data center may be sufficient to cause catastrophic failure of the components. Accordingly, even the earliest data centers were air conditioned twenty-four hours per day, every day of the year. As can be appreciated, cooling requirements often adds significant cost to the operation of a data center. Further, heat most often is the limiting factor in the density of components that may be placed into a data center.

In addition to temperature constraints, the amount of cabling required in data centers may be very high, due to the number of components that require network connectivity. Often, the racks in a data center are positioned on a raised floor, so that numerous cables may be run under the floor to provide connectivity to the components. Additionally or alternatively, the cables may be routed in cable trays that are positioned above the racks. Further, the racks themselves often contain multiple cables extending from them to components in the same, or other racks. The cables in a rack normally are attached to back of the mounted EDP equipment. Cabling clutter on the front or back of the mounted equipment is especially harmful to equipment cooling because the great majority of modern EDP equipment take in cooling air from the front of their chassis via the front of the cabinet and eject hot exhaust air at the rear of their chassis or vice versa. The mounted data processing equipment occupies the central volume of the rack, which is normally reserved for mounted equipment. A large number of cables may restrict the airflow and ventilation in the racks and in the data center generally, which has the effect impeding the cooling of the components in the data center.

Additionally, the available space in the equipment racks may be limited. The expense of a modern data center suggests optimum utilization of that space for end-use computer equipment. The communication cabling and associated equipment (e.g., the local area network, or LAN) may be considered a data center infrastructure, similar to power and cooling. Hence, removing the LAN components from the central volume of the equipment racks reserved for EDP equipment may improve the optimization of the deployment of the end-use equipment.

It is against this background that the data center network distribution system of the present invention has been developed.

SUMMARY

The present invention is directed to connecting rack-mounted data devices to a data network(s). The invention reduces the cabling required to connect such rack-mounted devices to network switches or other devices and improves the use of available equipment space. In this manner, cabling complexity is reduced, the space required for such cabling is reduced, and improved ventilation for cooling the network devices is provided. The invention also facilitates improved network connection redundancy so as to avoid or reduce the effects of failures at any network connection point.

In accordance with one aspect of the present invention, an apparatus is provided for facilitating connection of rack-mounted data devices to a data network. The apparatus includes a distribution strip and a number of network ports, disposed on the distribution strip, for use in connecting the rack-mounted devices to the network. The distribution strip has a longitudinal axis and is disposed in a rack such that a length of the distribution strip, defined relative to the longitudinal axis, extends primarily or exclusively along a vertical height axis of the rack. For example, the distribution strip may be disposed in a vertical orientation in the rack. In this regard, the distribution strip may be mounted in a corner of the rack or may be integrated into the rack structure so as to improve rack ventilation and avoid using rack space in the portion of the rack used to mount electronic data processing equipment.

The network ports may be distributed along the length of the distribution strip. For example, the ports can be distributed vertically along the rack such that short patch cords can be used to connect the data devices to the distribution strip. In this regard, the apparatus may incorporate a number of patch cords for connecting the rack-mounted data devices to the network ports, wherein substantially all of the patch cords have lengths that are substantially less than the height of the rack. As a further example, a majority of the patch cords may have lengths that are less than half the height and, more preferably, less than the width of the rack, which reduces cabling clutter and airflow blockage. This is especially true on the back of EDP equipment where the majority of the cables are usually connected and where the cooling air is usually ejecting from the EDP equipment as exhaust air.

Additional ports may be provided along the length of the distribution strip. For example, various diagnostic or other equipment used by data center technicians, e.g., thermometers, can be plugged into other types of ports, such as Universal Serial Bus (USB) ports, by providing ports on the distribution strip, the need to run cables for such instruments or other purposes can be reduced or substantially eliminated, thereby greatly enhancing convenience and efficiency of data center monitoring and servicing. In this regard, the distribution strip may include a "protocol gateway" that is operable to receive multiple transport protocols (e.g., USB, RS-232 serial, fiber channel, KVM, or the like) and use another transport protocol (e.g., TCP/IP, or other data transport protocol) to encapsulate and act as a transport gateway for the received protocols, for example, so as to virtualize USB ports and substantially reduce cabling. The Encapsulated Transport Protocol (ETP) may be delivered to the desired endpoint by TCP/IP to the distribution strip that is connected to the destination originally specified by the sending gateway. The receiving gateway then de-encapsulates and transmits in native formatting the original data through the associated transport protocol (e.g., USB, RS-232, serial, Fiber Channel, etc.) to the endpoint devices. In this regard, each USB port on a strip may be connected to a virtual USB bus. This bus may be defined as a user-selected set of strip USB ports on single or multiple strips or a network connected computer running the virtual USB connectivity application. The ports may be selected via a software application running on the strip, a computer workstation, or a dedicated device. The software application interface can be a Graphical User Interface (GUI) running on a computer workstation, a web interface, a command line interface or any combination thereof. The serial data may be encapsulated into a TCP/IP packet and then routed to all of the other USB ports in the "virtual USB bus." At the other USB ports, the data is then de-encapsulated and then directed to the USB ports on the bus and/or to a virtual USB port in a connected computer that is running the virtual USB connectivity application, which takes the incoming TCP/IP data stream and presents it to the computer running it as if it were a local USB connected port.

Each strip may further include Keyboard, Video and Mouse (KVM) functionality as well. For example, each strip may include logic structure for executing remote KVM functionality. For example, the USB port may be used in conjunction with an Ethernet port to provide KVM functionality. The video signal from an adjacent EDP device may be captured and translated into Ethernet protocol using a suitable adapter. The mouse and keyboard may be connected from the EDP device to the distribution strip via a short, standard USB cable. Additionally, a special KVM port may be placed in each port group on the distribution strip and used with a KVM adapter that plugs into the EDP equipment's video and USB port or video and PS2 type keyboard and mouse ports.

Each strip may further include a data network switch device. For example, each strip may include logic structure for executing network connectivity logic. In addition, the apparatus may further include a network indication device, associated with each of the network ports, for providing an indication of a network association of each port. For example, an LCD or LED display associated with each port may indicate a sub-network association of the port or other information. Each strip may further include at least one fiber port for connecting the strip to the network. As used herein the term "fiber port" may include various types of network ports that use various types of data cabling and protocols. For example, a fiber port may be a gigabit interface converter (GBIC) port Ethernet over copper. In one implementation, each strip includes at least two fiber ports. An associated method involves providing a distribution strip with network ports distributed along a vertical axis of a rack, and connecting each of multiple data devices in the rack to a vertically adjacent one of the network ports.

In accordance with a further aspect of the present invention, a method and apparatus ("utility") is provided for providing improved redundancy with regard to connections of rack-mounted devices to a data network. The utility involves providing a distribution strip associated with a first subset of a set of data devices, where the data devices are mounted in multiple racks, and providing first and second ports in connection with the distribution strip for connecting the strip to a network device. In this regard, the first and second ports can be used to provide separate, redundant connections to the network device for improved network connection reliability.

In accordance with a further aspect of the present invention, redundant connections are provided in relation to a number of distribution strips. An associated utility involves a first distribution strip associated with a first subset of a set of data devices, where the set of data devices are mounted in multiple racks, a second distribution strip associated with a second subset of the set of data devices, and, for each of the first and second distribution strips, first and second separate data connections to the data network. For example, the first subset of data devices may be mounted in a first rack, and the second subset of data devices may be mounted in a second rack. A variety of different topologies may be used to provide the desired redundancy. For example, for each of the distribution strips, the first and second separate data connections may extend directly to a network device of the data network. Alternatively, the first and second distribution strips may be connected in series in a loop to provide the first and second connections to one or more network devices. In the latter case, redundant connections are provided by communicating in either direction around the loop.

In accordance with another aspect of the present invention, a method is provided for enabling a network device to maintain its network identity when it is moved. For example, in the context of a data center, the network device may be a piece of electronic data processing (EDP) equipment (such as a server, data storage array, tape library, network switch, network router, etc.) or an associated network connection such as network port (e.g., a USB port, Ethernet port, fiber port, etc.) or set of ports (e.g., a moveable module or connectivity strip including multiple ports). It will be appreciated that maintaining the network identity of the network device is important in contexts where multiple network environments are governed. The case of a data center or multiple interconnected data centers is illustrative. Such data centers may host EDPs for multiple customers who rent space, bandwidth, quality of service or other resources. To accommodate these customers' ever-changing needs, data centers may be periodically expanded or reconfigured.

When such changes occur, it may be important to maintain the identity of a moved network device so that resources can be accounted for, security can be maintained and that any other consideration specific to that device can be addressed. For example, a data center may be divided into a number of subdivisions (that may or may not be physically separated to control access to equipment) each associated with one or more defined networks such as Virtual Local Area Networks ("VLANs"). Accordingly, the connectivity and operation of a network device, including any rules governing its access to and use of resources, may be governed by one or more policies. These policies may be defined in relation to a variety of factors including, for example, the physical location of the network device, the network association of the device, the network topology of the data center, the nature of the device, the identity of the owner or operator of the device, the address assignments of an associated network and others. These factors define network information for the network device.

The inventive method involves providing a network configuration manager (NCM) for maintaining network environments configurations and their connectivity policies. These network environments are defined by a "map" of the network which may include its topology, address space assignments and connectivity assignments, e.g., information sufficient to define the network and all the policies concerning the network connectivity of all the network devices in the network. The "map" may optionally include information about the physical location of the network devices that make up and are connected to the network or other information related to the network components and network devices. When a network device is initially plugged in or otherwise interconnected to a network governed by the NCM, an identity is assigned to the network device and stored, together with any other network information (e.g., network assignments) to identify a policy applicable to the network device, in persistent storage such as firmware associated with the network device. In the case of EDP equipment this may include a device ID (DID) specific to the equipment. In the case of a port or set of ports, this may include a connectivity strip ID, a port module ID and/or an ID for a specific port. This ID information can be set manually or automatically following policy settings.

Subsequently, when the network device is moved, it transmits ID information to the NCM upon being plugged in or otherwise interconnected to the NCM. The NCM then obtains any additional network information required to identify and implement policies for the network device. This may include the location of the device, the port, port module and/or network connectivity association of the device, the requested network for connection etc. This information may be transmitted from the device, from an associated port/module/strip or other associated device and/or accessed from a repository of map information. All of this information defines a network identity for the device. The NCM compares the network identity information to a repository of approved network identities contained in local or remote "maps." (The local "map" defines the local network, and remote "maps" define remote networks for which the local network has policies governing connection to them.) Based on this comparison, the NCM can determine whether the network device is authorized for connection to and use of a desired network and otherwise implement applicable policies. In addition, the NCM can remap networks and update map information in the device, associated devices and repository. In this manner, the network identity of a device can follow that device as it is moved without requiring a network technician to manually reconfigure a network.

DETAILED DESCRIPTION

Figure 1:
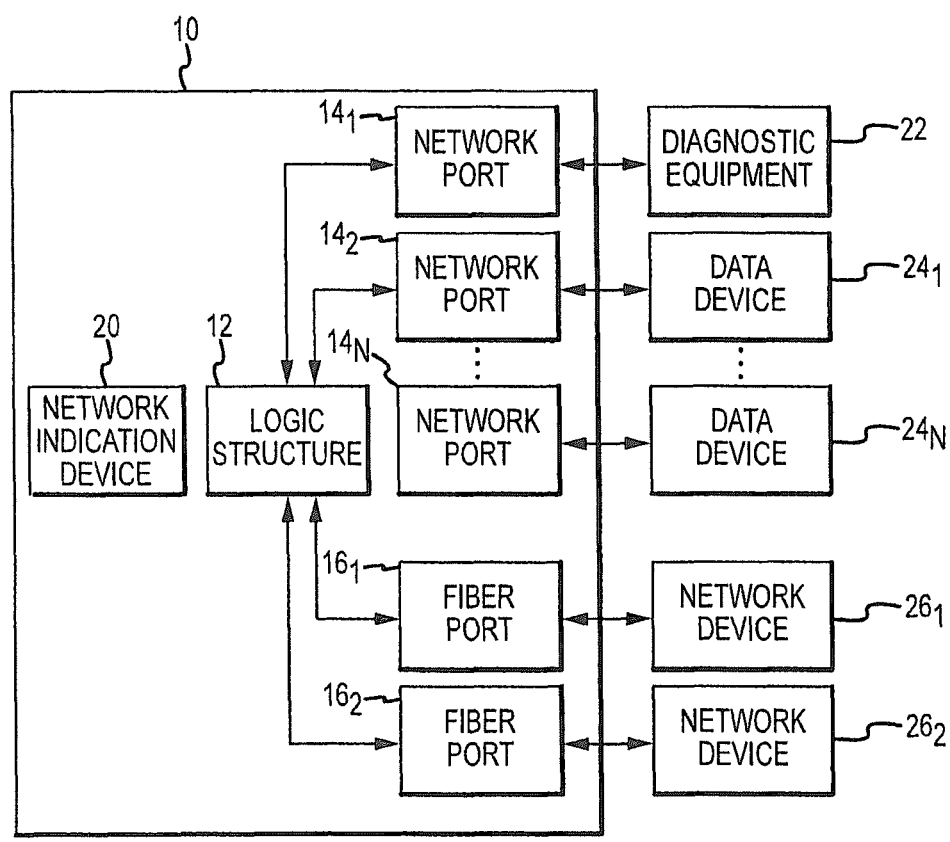
FIG. 1 illustrates a block diagram of an exemplary distribution strip in accordance with an embodiment of the present invention.

Whereas the invention is susceptible to various modifications and alternative forms, specific embodiments thereof have been shown by way of example in the drawings and are herein described in detail. It should be understood, however, that it is not intended to limit the invention to the particular form disclosed, but rather, the invention is to cover all modifications, equivalents, and alternatives falling within the scope and spirit of the invention as defined by the claims.

FIG. 1 illustrates a block diagram of an exemplary distribution strip 10 according to one embodiment of the present invention. The distribution strip 10 may include a plurality of ports $14_1$-$14_N$ (wherein "N" is merely used to represent some integer greater than one, and does not necessarily indicate that the same number is being represented), positioned on the distribution strip 10, that are adapted to connect to data devices $24_1$-$24_N$ that may be mounted in a conventional rack or cabinet in a data center. The ports $14_1$-$14_N$ may be distributed along whatever vertical modulus is appropriate for the application. For example, if the strip 10 was used in a standard NEMA rack, the vertical spacing may be 1.75 inches (e.g., one rack unit or "1 U"), or a multiple of 1.75 inches. The network port groups $14_1$-$14_N$ may be of multiple types for multiple purposes. The network port groups are sets of one or more network ports that are located at the same vertical position on the distribution strip. See FIG. 6A for an example of the configuration. For example, the ports group $14_1$-$14_N$ may be copper Ethernet, fiber Ethernet, fiber channel, USB, other types of ports, or a combination thereof. In addition to data devices, additional equipment (e.g., diagnostic equipment 22) may be connected to the distribution strip 10. For example, thermometers, moisture sensors, video cameras, or the like may be plugged into the appropriate ports $14_1$-$14_N$. Further, a USB device may be plugged into a port (e.g., the port $14_1$) to provide USB connectivity to other equipment in the data center.

The distribution strip 10 may further include logic structure 12 for executing network connectivity logic (e.g., a data network switch device). The logic structure 12 may be operable to communicate with various devices connected to the ports $14_1$-$14_N$. Further, the distribution strip may include two (or more) fiber ports shown as $16_1$ and $16_2$ that may be operable to communicate with network devices $26_1$ and $26_2$. As previously described the fiber ports $16_1$ and $16_2$ may be any type of ports that are operable to provide communication between the network devices $26_1$ and $26_2$ and the strip 10 (e.g., fiber, copper, etc.)

The distribution strip 10 may also include one or more network indication device(s) 20 for providing an indication of a network association for each of the ports $14_1$-$14_N$. For example, the network indication device 20 may include one or more light emitting diode (LED) or liquid crystal display (LCD) modules associated with each port, and may indicate a sub-network association or other information for each port. Further, the network indication device 20 may provide status or other diagnostic information to a technician. One advantage of the present invention is that the size and number of displays are less restricted than traditional network devices because the distribution strip 10 does not occupy any rack space. Thus, the present invention may incorporate a visual display for each network port group in the distribution strip 10. The display may be adapted to display alphanumeric information, symbols, or any other image a bit-mapped dot matrix display can display. The network indication devices 20 may be used to display the network logical sub-unit that a port is currently assigned to, network addresses of connected equipment, network bandwidth utilization and direction, error codes and messages, or other information that may be useful. The network indication devices 20 may be controlled in any number of ways including a manual interface, such as a push button interface, a web-integrated interface, a network management application that is operated by the user or data center personnel, or the like. The network indication device 20 may be modular in nature and thus is not constrained as to position in the strip, or count. An individual module can assume the role as the interface for all of the installed network port modules between itself and the next adjacent network indication device (if any) on the strip, or it may be assigned specific network ports to display. It can also provide general information within the limits of its display field from the NCM.

Figure 2:
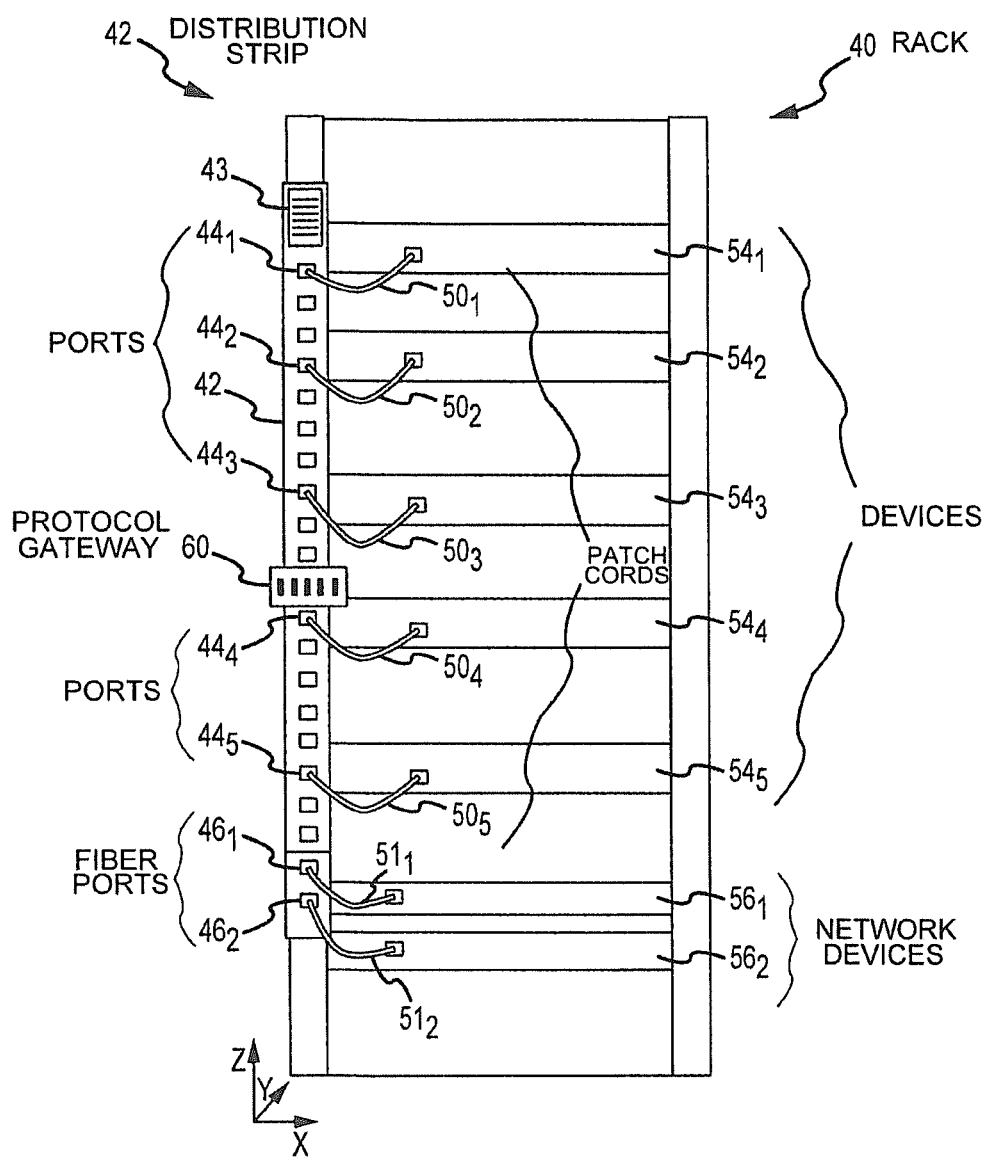
FIG. 2 illustrates a distribution strip in accordance with an embodiment of the present invention.

FIG. 2 illustrates an application for an exemplary distribution strip 42 in accordance with an embodiment of the present invention. As shown, the distribution strip 42 may be mounted to a corner of a rack structure 40. The distribution strip 42 has a longitudinal axis and is disposed on the rack 40 such that a length of the distribution strip 42, defined relative to the longitudinal axis, extends primarily along the vertical height axis of the rack 40.

The distribution strip 42 may include a plurality of ports (e.g., network or other ports $44_1$-$44_5$) that are distributed vertically along the rack 40 such that short patch cords $50_1$-$50_5$ may be used to connect rack-mounted data devices $54_1$-$54_5$ to the distribution strip 42. The vertical spacing between the sets of ports may be related to an industry standard applicable to the vertical mounting dimensions in the racks of the end-use equipment. As an example, the generally accepted standard for Information Technology (IT) is the National Electrical Manufacturers Association (NEMA) standard of vertical spacing of 1.75 inches (2 U). The configuration of the distribution strip 42 permits the patch cords $54_1$-$54_5$ to be relatively short in length. For example, the patch cords $54_1$-$54_5$ may have lengths that are generally equal to or less than one-half the height of the rack and, more preferably, equal to or less than the width of the rack 40. In this regard, cabling complexity is reduced. Further, the space required for such cabling is reduced, which provides for improved ventilation for cooling the devices.

The distribution strip 42 may further include other components such as a protocol gateway 60 that may be plugged into one of the network ports or integrated into the strip 42 itself. The protocol gateway 60 may function to receive multiple data transport protocols (e.g., RS232 serial, USB, Ethernet, fiber channel, or the like) and use another data transport protocol (e.g., TCP/IP) to encapsulate and act as a transport gateway for the multiple protocols. This feature may be advantageous because one of the primary causes of the increase in the number of cables in data centers is the use of different transport protocols for different functions within the data center. Such functions may include data transport, keyboard/video/mouse (KVM) remote control systems, environmental/security monitoring (e.g., video, temperature, humidity, moisture, lights, noise, smoke, fire, etc.), or the like. By enabling multiple protocols to be transferred across a data center using a single, data cabling system (transport) the protocol gateway 60 may reduce or eliminate the need for multiple parallel cabling systems. Further, if the endpoint destination equipment of the protocol being transported by the gateway 60 is not a piece of equipment that is near another distribution strip, it may be connected to the equipment via an adapter gateway module that functions similarly to the protocol gateway 60.

In addition to the aforementioned interface ports, the distribution strip 42 may further include a plurality of gigabit interface converter (GBIC) ports, distributed vertically along the strip 42. A GBIC is a standard for transceivers, commonly used with Gigabit Ethernet and Fibre Channel. By offering a standard, hot-swappable electrical interface, one gigabit Ethernet port may support a wide range of physical media, from copper to fiber. Hence, one of the advantages of including GBIC ports in the distribution strip 42 is the added flexibility they provide.

Other equipment may be plugged into a network port or the protocol gateway 60, where it may then communicate with other devices on the network. For example, various diagnostic equipment may be plugged into the protocol gateway 60, or directly into one or more of the network ports. In this regard, the need to run additional cables for such instruments or other purposes may be reduced or substantially eliminated, thereby enhancing the convenience and efficiency of data center monitoring and servicing.

The protocol gateway 60 may include several features including USB virtual connectivity, Serial virtual connectivity, KVM, and other protocol gateway functionality. Each USB port on the distribution strip 42 may be connected to a virtual USB bus. This bus may be defined as a user-selected set of ports on the distribution strip 42 and other strips in the data center or computers running the virtual USB connectivity application. These ports may be selected via a software interface on an application running on the distribution strip 42, a computer workstation, or a dedicated device, all of which have TCP/IP network connectivity between them. The software interface may be a command line interface, web interface, or a GUI running on a computer workstation or any combination thereof.

Each USB port may be connected to a USB interface device, such as a computer USB port, a USB thermometer, USB video camera, USB door lock sensor, USB moisture sensor, etc. either plugged directly into the USB port or connected via a standard USB cable. The USB cable may be relatively short since the rack-mounted device will be close to a USB port on the distribution strip, reducing cable clutter.

The serial data from each USB port may be taken and encapsulated into a TCP/IP packet and then routed to all of the other USB ports in the "virtual USB bus" which can be on any other distribution strip or any computer workstation running a virtual USB connectivity application. At all other USB ports on the "virtual USB bus" the data from the first USB connected device is de-encapsulated and then directed to the USB port(s) on the bus and/or to a virtual USB port in a connected computer running the virtual USB connectivity application which takes the incoming TCP/IP data stream and presents it to the computer running it as if it were a local connected USB port.

An important feature of the invention is "bandwidth limiting." Based on the uplink speed of the data switch or the measured, inferred, or user-defined network bandwidth between the two USB endpoints, the speed mode of the USB port(s) of the distribution strip 42 will be set to be either USB mode 1.1 with a speed of 12 Mb/s or USB mode 2.0 with a speed of 480 Mb/s or future USB standard speeds. This helps prevent the USB ports from oversubscribing the uplink capacity of the network switch in the distribution strip 42. The network switch may also utilize other bandwidth allocation methods to limit the amount of data traffic used by the USB virtual connectivity functionality.

The protocol gateway 60 may also provide serial virtual connectivity for RS-232, RS-422, RS-449, and RS-485 serial ports. Although only RS-232 ports are described below, all of the types listed above and any other supported serial protocol will work as described for the RS-232 ports.

Each RS-232 port on the distribution strip 42 may be connected to a virtual serial connection. This connection may be and usually is point-to-point or one-to-one-with-shadow-listeners. These virtual serial connections are defined as a user-selected pairs of RS-232 ports that will listen to both of the talking ports communicate. These virtual serial ports are selected via a software interface on an application virtual serial connectivity manager running on the distribution strip 42, on a computer workstation, or a dedicated device, all of which have TCP/IP network connectivity between them. The software interface may be a command line interface, a web interface, or a traditional GUI running on a computer workstation or any combination thereof.

Each RS-232 port is connected to a RS-232 interface device, such as a computer server RS-232 port, a RS-232 thermometer, RS-232 door lock sensor, RS-232 moisture sensor, etc., via a standard RS-232 cable. The RS-232 cable can be short since the rack mounted devices will be close to the RS-232 port of the distribution strip 42, reducing cabling clutter.

The serial data from each RS-232 port is taken and encapsulated into a TCP/IP packet and then routed to all of the other RS-232 ports in the "virtual RS-232 connection" which can be on any other distribution strip 42 or any computer workstation running a "Virtual RS-232 Connection" application. At all the other RS-232 ports on the "Virtual RS-232 Connection" the data from the first RS-232 connected device is de-encapsulated and then directed to the RS-232 ports(s) on the connection and/or to a virtual RS-232 port in a connected computer running the "Virtual RS-232 Connectivity" application which takes the incoming TCP/IP data stream and presents it to the computer running it as if it were a local RS-232 connected port. The distribution strip(s) with participating RS-232 ports and/or computer workstations or dedicated devices running the "Virtual RS-232 Connection" application will know which ports are the connected ports and which are shadow ports as set by the user via the "Virtual Serial Connectivity Manager Application." The connected ports are put in a read-write mode and the shadow ports are read-only.

Again, an important feature of our invention is bandwidth limiting. Based the uplink speed of the network switch in the distribution strip or the measured, inferred, or user-defined network bandwidth between the two serial endpoints, the speed mode of the serial port or ports on the distribution strip 42 will be set to be a value that does not oversubscribe the uplink speed of the distribution strip 42. This helps to prevent the serial ports from oversubscribing the uplink capacity of the distribution strip 42 network switch. The distribution strip 42 switch may also utilize other bandwidth allocation methods to limit the amount of data traffic used by the RS-232 Virtual Connectivity function.

The distribution strip 42 may also incorporate a keyboard, mouse, and video (KVM) functionality as follows. The video output of an electronic data processing device may be connected via an adapter to an adjacent Ethernet port on the distribution strip 42, which has been placed into KVM mode. In this mode, the KVM logic in the distribution unit 42 controls and uses the Ethernet port. The KVM logic is operable to provide signaling at all active remote KVM ports or endpoint EDP equipment or devices necessary to maintain "active" status at each of those ports, even when not connected to a virtual local keyboard, video display and/or mouse. The KVM logic performs all the functions necessary to ensure that the EDP device being remotely connected maintains connection to the virtual keyboard, video display and mouse. The KVM logic also detects the video transmitted by the EDP equipment and the keyboard and mouse data received by the EDP equipment. A video to Ethernet adapter may be used to digitize the analog output (or to just input digital data for digital output video) and input it into the Ethernet port in KVM mode. The KVM logic will then take the video data and encapsulated it into a TCP/IP packet and hand that packet off to the distribution strip 42 network switch logic. This same functionality may also be done via a dedicated KVM port that is specialized for that role but combines the functions of the Ethernet virtual video port and the virtual USB connection port.

Each KVM mode Ethernet port on the distribution strip 42 may be connected to a virtual video connection between two KVM mode Ethernet ports, or a dedicated device or computer workstation running the remote KVM application. This connection may be and usually is point-to-point or one-to-one-with-shadow-listeners. These virtual video connections are defined as a user selected pairs of KVM mode Ethernet ports plus a set of KVM mode Ethernet ports that are in shadow mode and will all receive the video information. These virtual video ports are selected via a software interface on an application "virtual video connectivity manager" running on the distribution strip 42 or a computer workstation or a dedicated device, all of which have TCP/IP network connectivity between them. The software interface can be done via a command line interface, a web interface, or a traditional GUI running on a computer workstation or any combination thereof.

The keyboard and mouse functionality is handled by using a USB Virtual Connection between a USB port on the EDP device being remotely KVM connected and mouse, a dedicated device or a computer workstation running the "Remote KVM Application". This application connects the remote USB port to the keyboard and mouse on the computer workstation in an appropriate manner so that the remote device "sees" the keyboard and mouse as being locally connected and active. It also takes the remote video feed and displays it on the computer workstation in the "Remote KVM Application" windows by de-encapsulating it from TCP/IP and handling it off to the application, which displays it. The application allows the user to select any of the remote EDP devices that are remote KVM connected and switch between them. The video for each can be displayed in a separate GUI window and the active GUI window in the application can indicate which remote EDP device is active and will receive keyboard and mouse input. This approach can be extended to multiple computer workstations (or dedicated devices) so that multiple users can connect via the remote KVM functionality to the same remote KVM EDP device. Multiple users can be active at once or one can be active and the others in "shadow" mode with no keyboard and mouse input ability. This feature is useful for collaborative work or training.

A more direct method is to use a "plugboard" approach and use the video and USB connectivity between two distribution units to connect the EDP video and USB ports to an actual remote keyboard and video monitor. The switching function between EDP devices can be done by the strip that is controlled by the user via a command line interface or a web interface. The KVM logic in each strip insures that each KVM connected EDP device "senses" a connected virtual monitor, keyboard and mouse as needed to insure normal operation.

This method can be used for PS2 style keyboard and mice, with an appropriate adapter, since PS2 is just another serial communication protocol that can easily be converted to USB.

The distribution strip 42 may also be used to gateway other protocols such as Fibre Channel, etc. The advantages of doing so are that it eliminates the need to run multiple parallel cabling systems and reduces the amount of cabling and cabling clutter in the rack. This can be achieved by encapsulating and gatewaying these protocols via TCP/IP (or other protocols) on the data center network between ports on distribution units. Ports that are specific to these protocols may be provided in each network port group for that purpose and connected in point-to point or other communication topologies as are appropriate for each protocol and supportable via TCP/IP or other network protocols. Another possibility, for example, is to use Ethernet to support multiple network protocols in parallel. Ethernet can support both TCP/IP and Fiber Channel over Ethernet (FCoE) over the same fiber port.

As discussed above in relation to FIG. 1, the distribution strip 42 may also include logic structure (e.g., implemented on one or more integrated circuit boards inside the distribution strip 42) for executing network connectivity logic. Further, the distribution strip 42 may include two or more shown as fiber ports $46_1$ and $46_2$ for connecting the distribution strip 42 to a network. As shown, the distribution strip 42 is connected to two network devices $56_1$ and $56_2$ through patch cables $51_1$ and $51_2$, respectively. In this configuration, the distribution strip 42 is connected to the two network devices $56_1$ and $56_2$ though separate connections, which provides redundancy and may increase the reliability of the system.

The distribution strip 42 may further include one or more network indication devices (e.g., an LCD 43) for providing a visual indication to a technician of a network association of each of the network ports and fiber ports. For example, the LCD 43 may indicate a sub-network association of the various ports. Further, the LCD 43 may indicate other status or diagnostic information to a data center technician.

Figure 3:
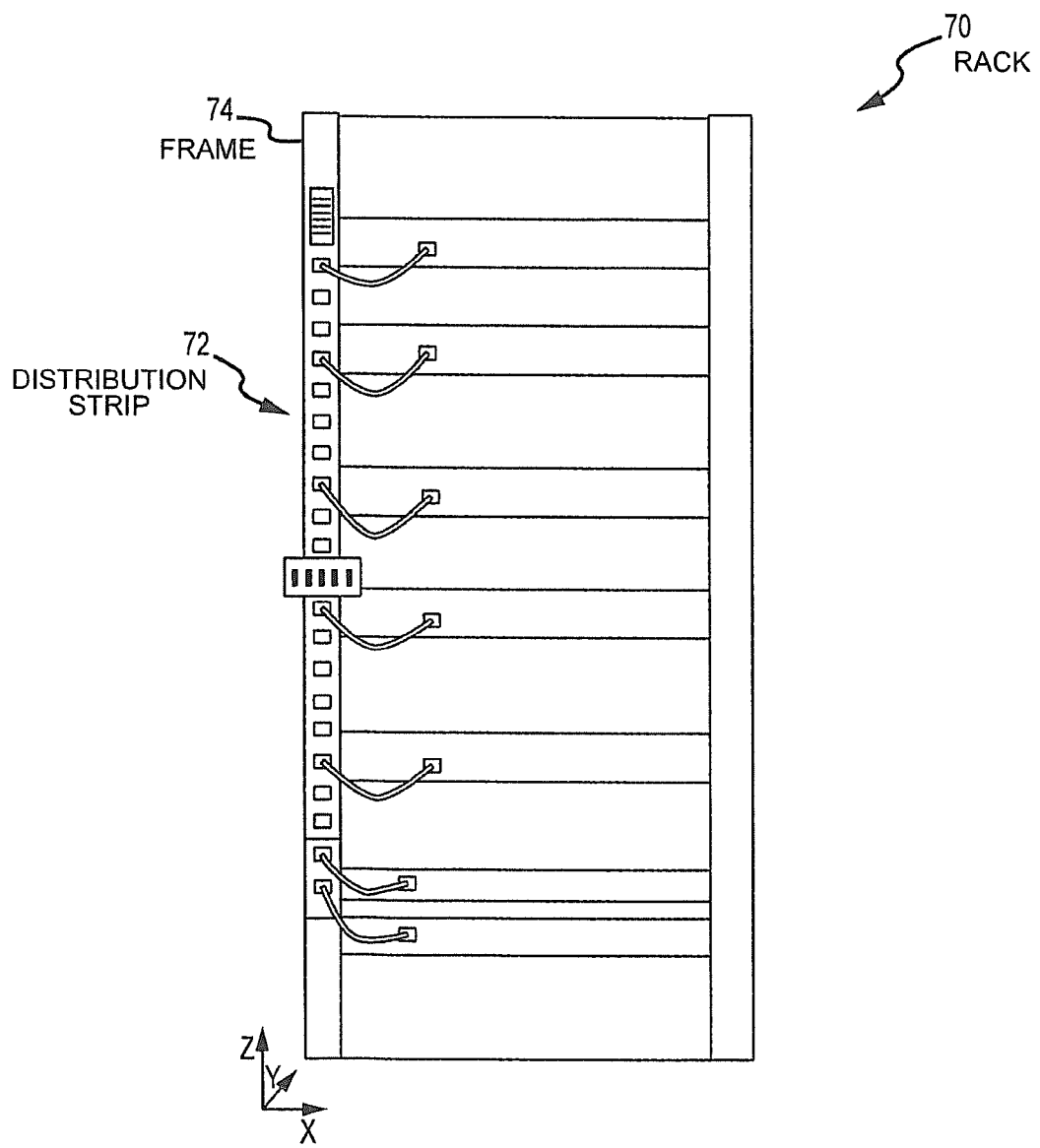
FIG. 3 illustrates another distribution strip in accordance with an embodiment of the present invention.

FIG. 3 illustrates a data center network distribution system where a distribution strip 72 has been incorporated directly into a portion of a rack structure 70. For clarity, only those objects that differ from those shown in FIG. 2 are referenced in FIG. 3 and described herein. As shown, the distribution strip 72 is integrally formed into a frame 74 along one side of the rack 70. In this configuration, the space required for the distribution strip 72 is minimized because it is fit into the existing form factor of the rack 70. Further, the distribution strip 72 may be incorporated to any desirable portions of the rack 70. As can be appreciated, incorporating the distribution strip 72 into the frame of the rack 70 reduces the space required for the distribution strip 72, which provides for greater useable rack space and better cooling.

Figure 4:
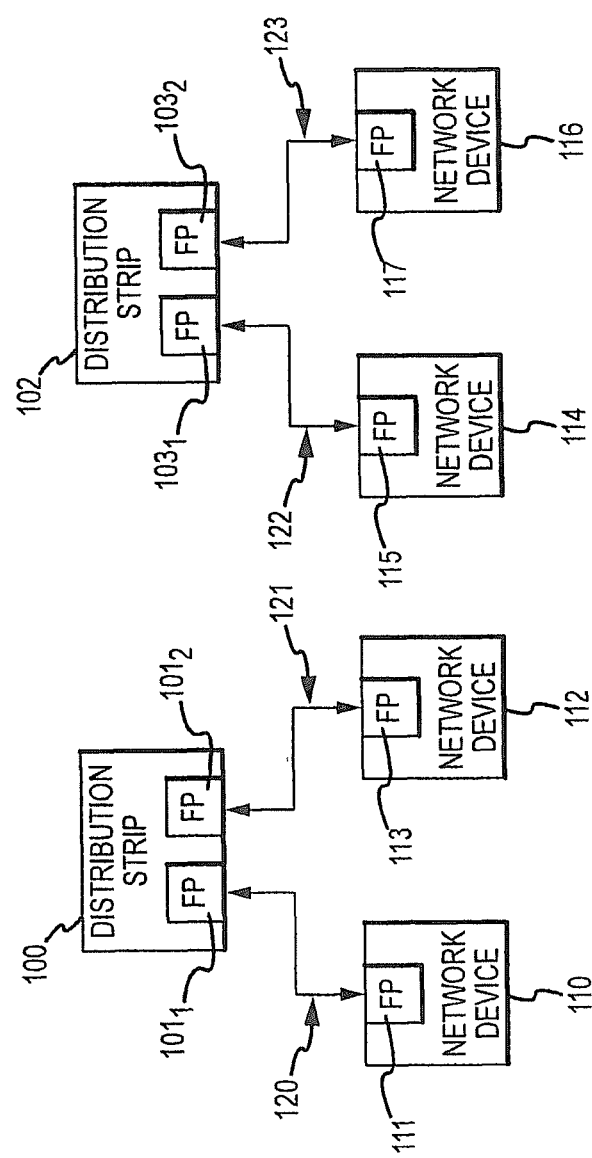
FIG. 4 illustrates a block diagram of an application for a data center network distribution system, commonly referred to as a "star topology."

FIG. 4 illustrates a block diagram of the connectivity for a data center that incorporates a data center network distribution system of the present invention to improve the redundancy with regard to rack-mounted devices. This topology may generally be referred to as a "star topology." As shown, a distribution strip 100 that is associated with a first subset of a set of data devices (e.g., the data devices $24_1$-$24_N$ shown in FIG. 1), where the set of data devices are mounted in multiple racks, is provided and includes a first fiber port (FP) $101_1$ and a second fiber port $101_2$. The fiber ports $101_1$ and $101_2$ are connected to separate network devices 110 and 112 that include fiber ports 111 and 113 through the cables 120 and 121. Similarly, another distribution strip 102 that is associated with a second subset of a set of data devices is provided and includes first and second fiber ports $103_1$ and $103_2$. The fiber ports $103_1$ and $103_2$ are connected to separate network devices 114 and 116 that include fiber ports 115 and 117 through the cables 122 and 123. In this regard, the data devices associated with each distribution strip 100 and 102 are provided with separate, redundant connections to the network, which improves network connection reliability. It should be appreciated that each subset of data devices may be arranged in any suitable manner. For example, a first subset of data devices may be mounted in a first rack, and a second subset of data devices may be mounted in a second rack.

Figure 5:
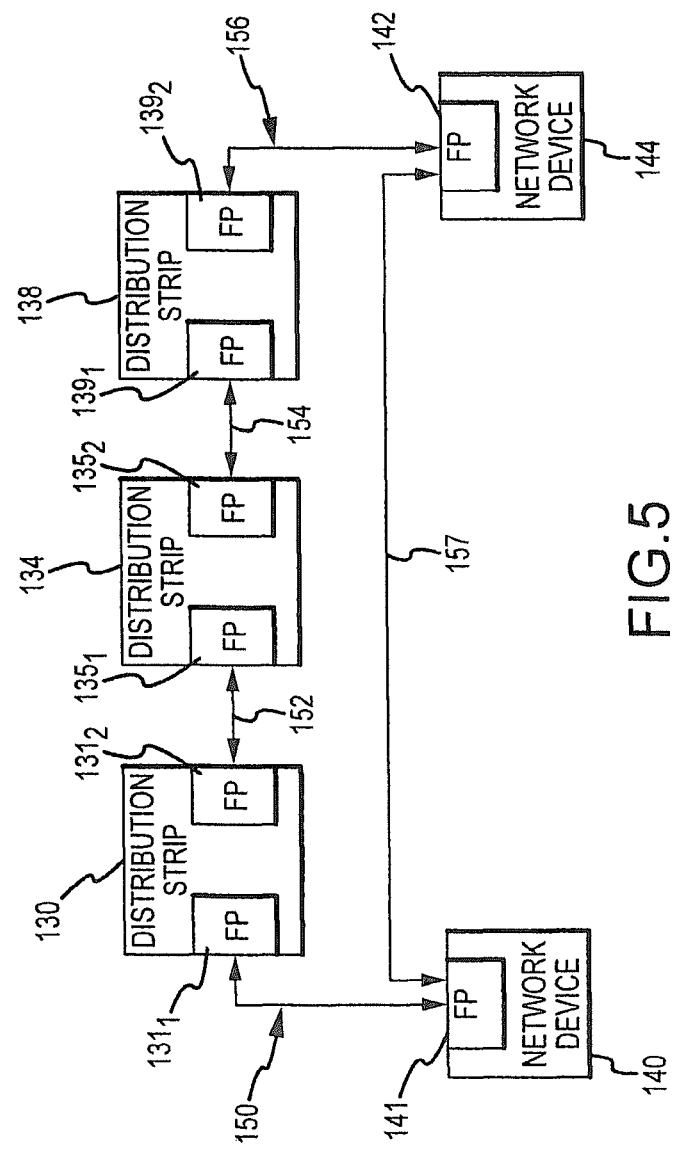
FIG. 5 illustrates another block diagram of an application for a data center network distribution system, commonly referred to as a "ring topology."

FIG. 5 illustrates a block diagram of another topology that may be used to implement the data center network distribution system of the present invention. This topology may generally be referred to as a "ring topology." In this configuration a set of distribution strips 130, 134, 138 are connected in series. That is, a fiber port $135_1$ of the distribution strip 134 is connected to a fiber port $131_2$ of the distribution strip 130 via a cable 152, and a fiber port $135_2$ of the distribution strip 134 is connected to a fiber port $139_1$ of the distribution strip 138 via a cable 154. The distributions strips 130 and 138 at the "ends" of the serial connection are connected to network devices 140 and 144, respectively (via fiber ports 141 and 142), through the cables 150 and 156. The network devices 140 and 144 are coupled together via a cable 157. This allows the network devices to communicate bidirectionally, and closes the "ring." As can be appreciated, the redundant connections in this configuration are provided by communication in either direction in the chain. That is, if a break occurs at any connection point, the network connectivity will not be compromised because traffic may flow to another network device. This implementation has several advantages, including a potential reduction of the number of cables required, since patch cables are not required between every data device and a network device. Additionally, since the distribution strips 130, 134, 138 will generally be located on each side of a rack or in adjacent racks in a row of racks, the connections 152 and 154 between the distribution strips 130, 134, 138 will generally be very short, which has the effect of reducing clutter and improving ventilation for cooling the system.

As can be appreciated more fiber ports can be provided and utilized to implement each of the connections in each of the topologies described above in parallel (between the same two endpoints). While this can increase link reliability, it is more commonly applied to increase the total link speed between the endpoints by logically joining the multiple links in a parallel fashion to create a higher speed link.

Figure 6A:
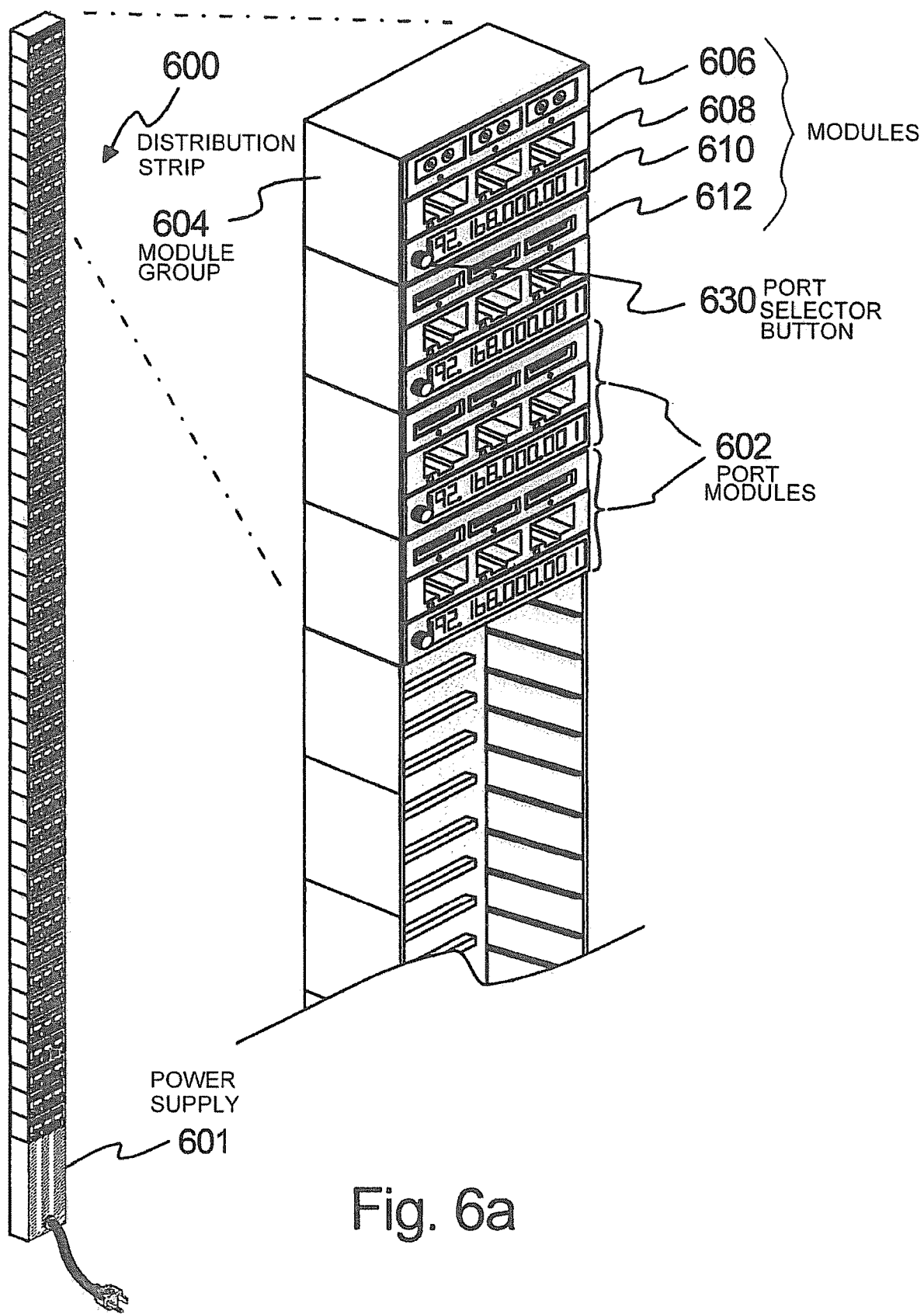
FIGS. 6A-6C show a modular network distribution strip in accordance with a further embodiment of the invention.
Figure 6B:
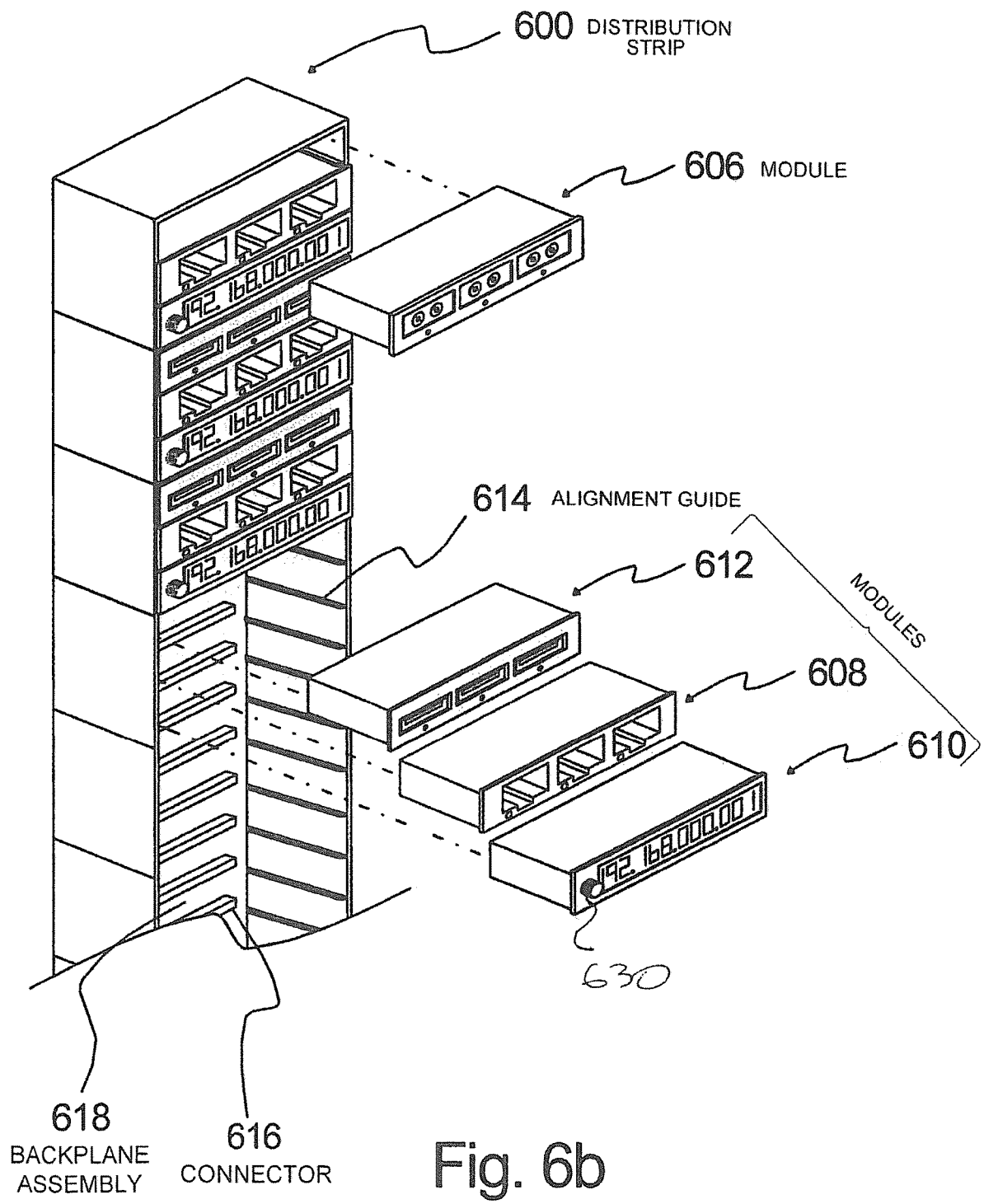

FIGS. 6A-6B shows a further embodiment of a distribution strip 600 in accordance with the present invention including a number of port modules 602. The modules 602 are shown in more detail in connection with the blown-up section 604 of strip 600. As discussed above, the strip 600 may be dimensioned to be included in a vertical orientation within a data center rack. For example, the strip 600 may be positioned in a corner of a rack and extend substantially across the entire vertical height of the rack so as to provide port access for equipment at each vertical position within the rack. It will be appreciated that different connectivity options may be required for different equipment within the rack. Thus, for example, a particular piece of equipment such as a server may require access to multiple ports of different types, e.g., two Ethernet ports and a USB port. Accordingly, it may be desired to provide different combinations of port types at different vertical positions of the strips 600. This is accomplished in the illustrated embodiment (6A) as follows. The distribution strip 600 consists of a number of module groups 604, each occupying an appropriate vertical dimension, such as 1 "U" (1.75"). Each module group is comprised of an integer number of module slots (3 module slots as depicted). Any combination of modules needed may be used in a module group 602. Modules may be of vertical size so as to occupy one or more vertical slots. The modules 606, 608, 610, 612 can individually be inserted into and removed from the strip 600. The strip chassis 616 may include alignment guides 614 (FIG. 6B) to assist in insertion and removal of modules. Connectivity to the module is accomplished via a connector 616. Connector 616 is part of a parallel set of interconnects that appear at a similar connector at each slot. The assembly of the connectors, interconnecting leads and associated circuitry are part of the backplane assembly 618. Open module slots can be filled with blank covers or dummy modules.

Each module group 602 may include a selected any desired assortment of fiber ports 606, Ethernet ports 608, USB ports 612 and/or other ports as well as an alphanumeric or other display 610 and having a port selector button 630. For example, the display 610 may display the IP address of a selected port where the port is selected using a button 614 and indicated by an LED adjacent to the selected port. By virtue of this modular construction, a customer user can order or configure a custom strip 600 with their desired port options and display options at each vertical location of the rack. For example, a customer user may specify the desired composition and arrangement of modules within the strip 600, e.g., using a web-based ordering tool. Additionally or alternatively, a customer user may populate the various positions module slots (606, 608, 610, 612 and other types not shown) of the strip 600 with available modules 602. Moreover, if a user desires to reconfigure a rack or a data center, the customer user can optionally move modules 602 together with the associated equipment between different positions within a rack, between different racks within a data center, or between different data centers even if those data centers are separated by a great distance.

FIG. 6B illustrates the blown-up view of the top section 604 in more detail. The four-U (7 inches) subsection chassis of the strip has four modules 606, 608, 610, 612 extracted. The chassis opening vacated by the four modules is evident. In the chassis opening, guides 614 are shown that separate each of the modules 606, 608, 610, 612 along the length of the chassis. The guides 614 are symmetrical on both sides of the chassis. A printed circuit board (PCB) 618 has connectors 616 that mate with the connectors on the back of the modules 606, 608, 610, 612. The PCB 618 also contains circuitry for managing the flow of data from each module to other modules. Various other circuits on the PCB 618 manage address information, store data and deliver power as needed to the modules.

It should be appreciated that the overall length of the strip can be any combination of the module group 604 vertical modulus for example 1 U (1.75 inches), and may include a further three inches for the power supply 601 (FIG. 6A), or greater, limited only by practical length limitations of intended market. A total length of 76.5 inches would include 42 U of modules (a common industry rack height) and about 3 inches for the power supply 601 (FIG. 6A). It should also be appreciated that by applying a uniform electrical interconnect scheme to all the PCB connectors 616 allows any module type to be placed in any location throughout the length of the assembly chassis.

Figure 6C:
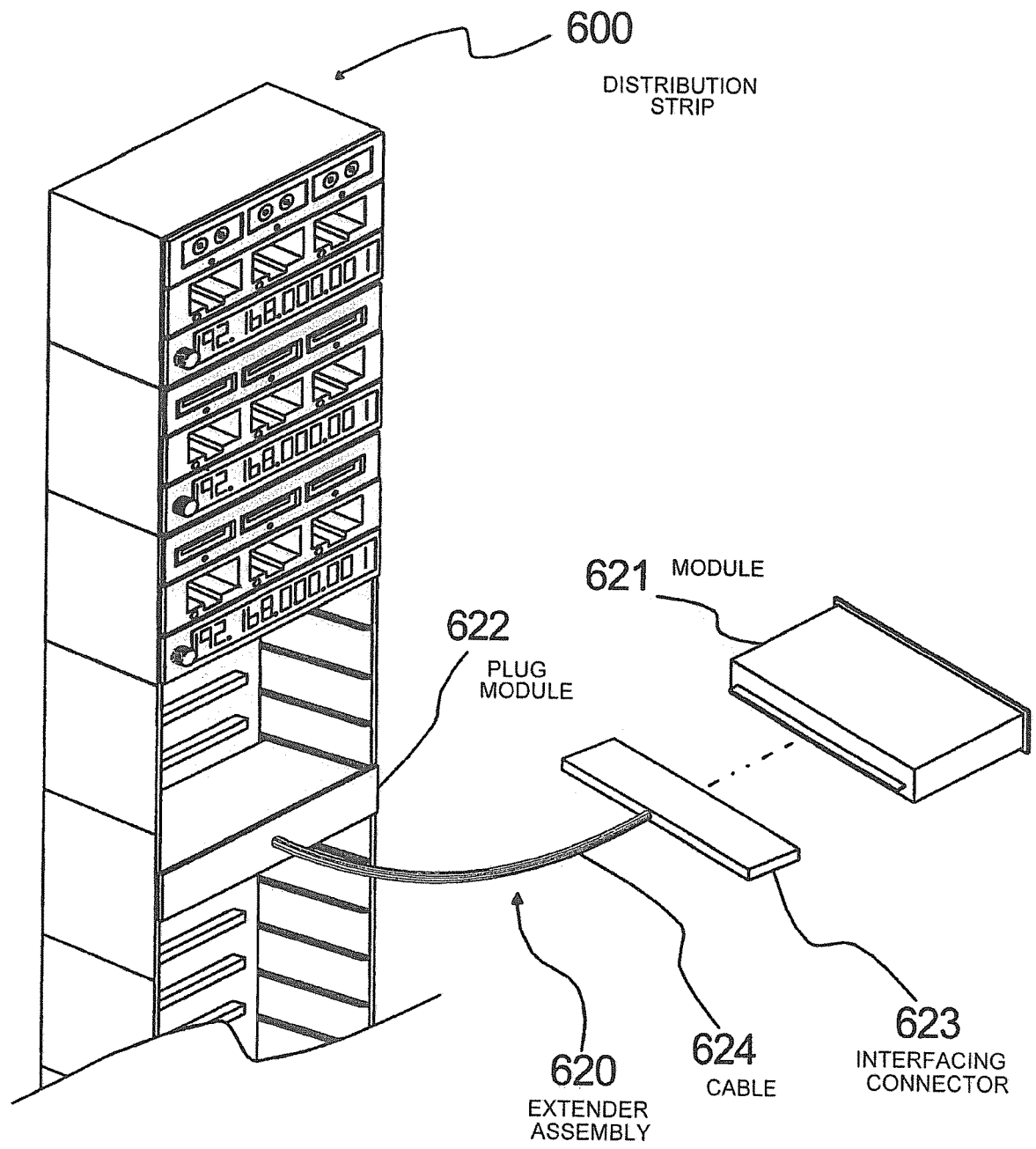

FIG. 6C illustrates an extender assembly 620 for extending the modules out of the strip 600. Modules so extended could be any module type, but most probable is the display module 610, which may be extended for easier access or visibility. The extender consists of a plug in module 622 that interfaces with the strip 600. The plug module 622 is connected to the user module interfacing connector 623 via high speed cable 624. It should be appreciated that the user module interfacing connector 623 can be in various formats. For example it can be a simple connector as shown. It could also be enclosed in a case or chassis that accepts a standard module for convenient mounting and protection of the module. The case or chassis could optionally be integrated into the structure of an equipment rack or cabinet.

Figure 7:
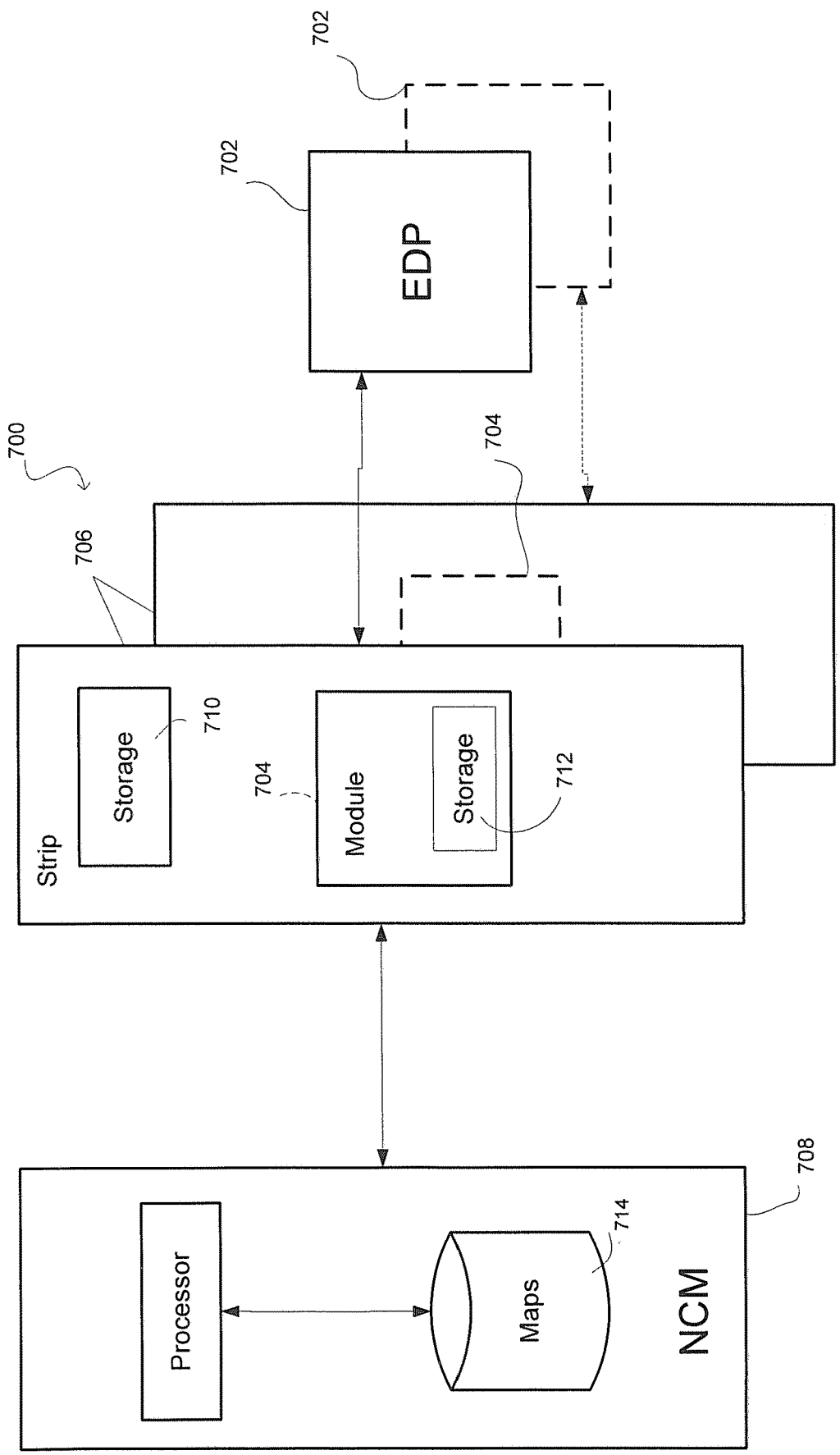
FIG. 7 is a schematic diagram of a system for managing moves of network devices in accordance with the present invention.

The invention also allows for the modules to be moved and retain their network identity and connectivity for each port in the module whether Ethernet, USB, etc. A system 700 for managing such moves is shown in FIG. 7. The system 700 enables electronic data processing (EDP) equipment 702 to be moved to different rack locations (in the same facility or in remote facilities) without requiring a network technician to manually reconfigure the network each time by allowing the network module (and its associated network information) to be relocated with the equipment. Such a move of an EDP 702, together with a port module 704, is indicated in phantom in FIG. 7. This is done in the following ways. The network implemented by the strips 706 can be configured by a network technician using a network configuration manager (NCM) 708 that runs on a distribution strip, a computer workstation (as shown)), server or a dedicated device, all of which have TCP/IP (or other suitable data transport protocol, but the preferred embodiment is TCP/IP) network connectivity between them. This can include using foreign network components such as routers and switches from other vendors that are used in standard ways, such as gateways to other networks or VLANs, etc. This is standard network functionality in multi-vendor implemented networks, such as is commonly found in TCP/IP (and other data transport protocols) environments.

The NCM software interface may be a command line interface, a web interface, a traditional GUI, or any combination thereof. The network technician can define the topology, routing, and address space of the network formed by the distribution strips using the NCM 708. This includes any restrictions on connectivity, between hosts and/or network sub-units (such as TCP/IP subnets or VLAN's) of the network defined by the topology, such as packet filtering, traffic policing or other router or firewall methods used to control connections between two or more hosts and/or networks (or sub-unites of networks). It also includes management of the address space, for example: directed assignment and communication of a specific host address to a device connected to a network port.

Bandwidth limiting and packet shaping can also be done on a per-strip, per-module or per-port basis as desired. The NCM 708 can be replicated for increased availability so that the NCM functionality is always available, or its functionality can be distributed between the computer workstation (or server) and the embedded devices and or the distribution strips 706 themselves. Each NCM 708 (including all of its replicas) control a management domain, which is the set of networks controlled by the NCM 708, regardless of their physical locations(s). The only requirement is that all of the components be connected by TCP/IP or another suitable data transport protocol.

Additionally, the technician can use the NCM 708 to set rules governing which network sub-units can appear and be connected in which distribution strips. These rules can operate on either or both of the logical structure of the network (topology and address space, etc.) and the physical location of the network distribution strips 706 and the port modules 704 in the strips 706, including the module slot locations in the distribution strip, for example. So, it may be desired to prohibit any or all ports in a port module 704 from functioning when it is moved from one location to another (which includes module moves within a single strip 706, useful for sub-divided equipment cabinets), because it violates the defined connectivity policy set in the NCM 708. This can be done when the port module is plugged into the new location and an error message can be displayed at the time.

The distribution strips 706 can each have a set of unique identifiers. Network Distribution Strip Virtual IDs (NDSVIDs) are assigned by the NCM 708 and stored in their firmware. Further, the port modules can each have and be assigned a set of unique identifiers, the Port Module Virtual ID (PMVID), that identify the port module as a whole and the Individual Port Virtual ID (IPVID) that identifies each port in the module individually. The NDSVIDs are assigned by the NCM 708 to the distribution strips 706 and stored in their firmware 710. The PMVID and IPVIDs are assigned by the NCM 708 to the port modules 704 and stored in their firmware 712.

The first time a distribution strip 706 is plugged into any network, or the processor 716 of the NCM 708 assigns it a NDSVID and each module 704 on that strip 706 a PMVID and each port a IPVID. The first time a port module 704 is activated, whether in a distribution strip 706 that has been activated for the first time or by being plugged into a distribution strip 706 for the first time, it will be assigned a PMVID for the module 704 and an IPVID for each port on the module 704 by the NCM 708. The PMVID and each IPVID are transmitted to the strip 706 when the module 704 is first plugged into the strip 706 or the strip 706 is powered on. They are then forwarded by the strip 706 to the NCM 708 for that network (a part of which may be locally implemented on the strip 706) and the NCM 708 then tells the strip 706 what to do as regards to letting each port on the module 704 just plugged in, or all the ports on all the modules 704 on the strip 706 just powered up, have full, limited or no network connectivity. It can be appreciated that it will be useful to encrypt the storage and transmission of this information to keep the network properly secured, and it is expected that implementations will generally be secured in this manner.

The NCM 708 also maintains in storage 714 network information defining a "map" of the logical network which may include its topology, address space assignments and connectivity policies, e.g., information sufficient to define the network. These are stored on the NCM(s) 708 in the management domain and on each port module 704 and every time a change is made to the "map" the copies on all modules 704 in the strips 706 managed by the NCM 708 are updated so that they are all identical. It can be appreciated that storing the "map" on each port module makes it possible to reconstruct the network from that copy of the "map" and that this feature can be useful. The NCM 708 can do version control on copies of the "map" so that changes to the network can be reversed and an earlier version of the network can be restored. The "map" can also optionally incorporate physical location data for each element of the network, the NCM 708 and the distribution strips 706 and the port modules 704. This is useful if the connectivity policies incorporate rules that depend on location. It will be appreciated that the location information and other network information may be separately stored by the NCM 708 rather than stored in device firmware 710 and/or 712 for subsequent reporting to the NCM 708. The map is stored digitally and has a unique digital signature.

An alternative implementation can use a subset of the "map" or network identity applicable to a network device. The network identity of each individual port is stored in its port module. In this implementation, the network information that is specific to each port on the port module (network characteristics, network connectivity policies, network address, subnet mask, gateway address, other routing information, etc.) is all that is stored on that module. When the module is moved, this network information is transmitted to the distribution strip, which transmits it to the NCM. The NCM then can then apply the network connection policies to decide what network connectivity to grant the module and instruct the network distribution strip (and any other required network devices) to implement it.

These elements enable modules to be moved from a first strip to a second strip, which then reconfigures itself to provide the required network configuration to enable each port on the port module to have the desired network functionality. This feature can be used for multiple data transport protocols (TCP/IP, Fiber Channel, Token Ring and others) and multiple link layer protocols (Ethernet, FDDI, HDLC, others) and other protocols (USB, RS-232, etc.). It should also be noted that it can work with different physical media and that the physical media can be interchanged via GBIC's or other means independent of the network identity of each port in the port module.

Figure 8:
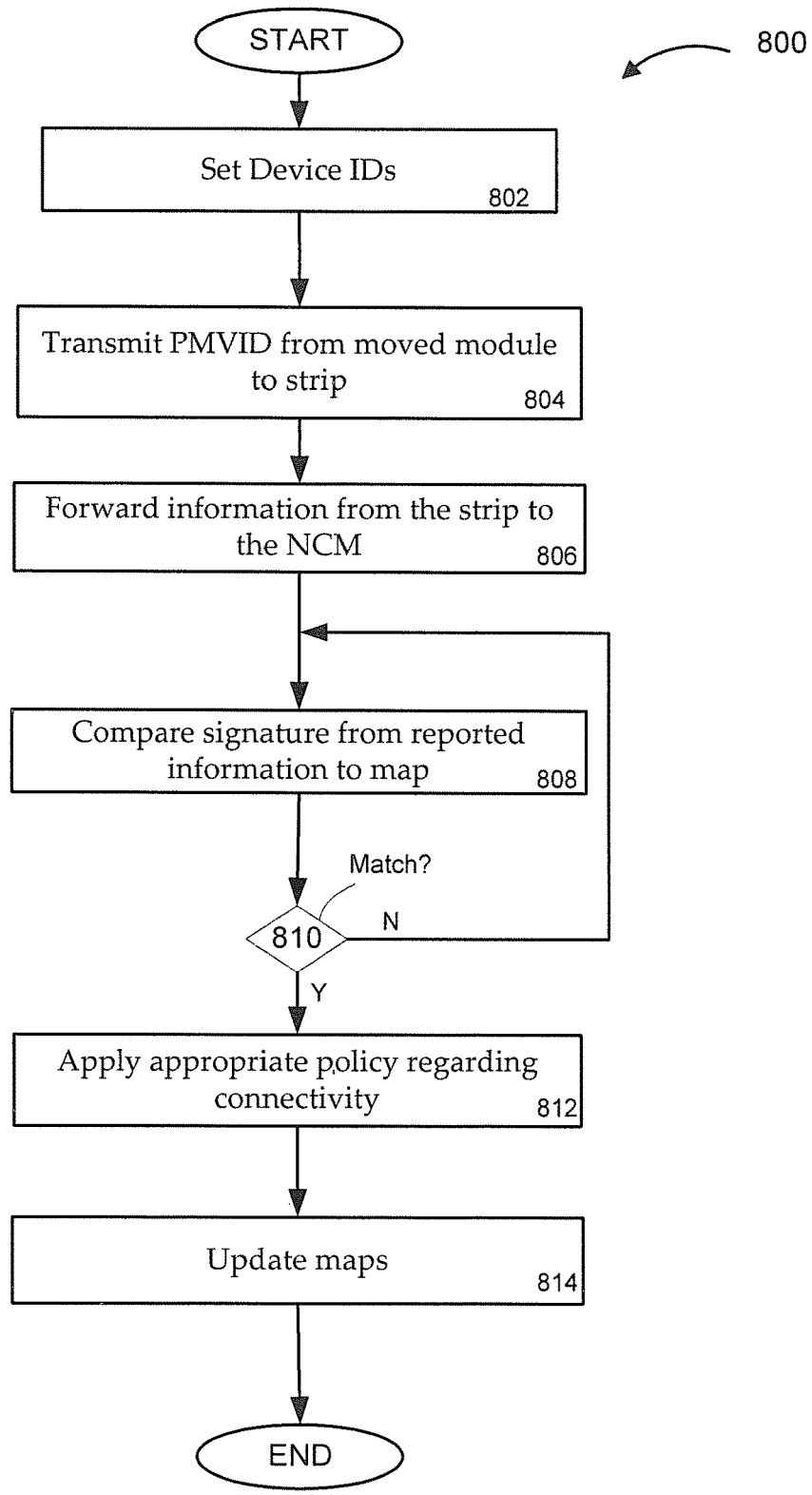
FIG. 8 is a flow chart of a process implemented by the system of FIG. 7.

FIG. 8 shows a process 800 for managing module moves. Assuming the module has been activated at least once and has a network identity assigned to one or more ports on it, the NDSVID, PMVID, an IPVID(s) have all been set 802 by the NCM, either manually or automatically by following the policy settings, which include default policies that can be used when a module is plugged in (one of which can be to not enable any network connectivity, generate an alert and wait for operator intervention, useful for high security environments).

When the module is then moved, the following preferred sequence of events can be implemented. The module is plugged in and transmits 804 its PMVID and all its defined (at least one) IPVID(s) and it's copy of the "map" to the distribution strip. The distribution strip forwards 806 all of this information to the NCM (and may supplement these IDs with its NDSVID or other network information, e.g., to identify the new module location). The NCM takes the digital signature of the device modules copy of the "map" and compares 808 it to the digital signature of its current copy of the "map" to see if they match 810. It should be appreciated that in the case of a "map" being a subset of the information needed to define the network, the network "map" of the entire network can be organized so that such entities in the network "map" each also have individual signatures that can be searched against. If they don't, the NCM will then compare the digital signature received to a list of approved "maps" and look for a match. These approved "maps" may relate to other networks managed by other NCMs that have a connectivity policy defined in the local NCM that direct how to treat modules coming from those networks. This can include creation and routing of new network entities (such as VLANs), remapping of network entities (such as VLANs) to new addresses, and preserving or reassigning host addresses. The NCM may also obtain network information from other sources, e.g., identifying the new location. If no match can be found, a default policy may be applied, e.g., preventing connectivity or allowing limited connectivity. Other actions may also be taken such as generating an alert or displaying an error message. When a match is found, the result is the desired connectivity between the new module and the network (and any networks that it can reach) is established in accordance with the connectivity policy 812. All other actions that may need to be taken to implement the policy such as directed assignment and communication of a specific host address to a device connected to a network port and/or directed assignment and communication of other network information needed to establish the desired network connectivity such as subnet mask, default gateway, etc., will also be done when the device is plugged into the activated port in the port module. The NCM can then update 814 all copies of the "maps" as appropriate.

An addition security function can also optionally be implemented. This is to confirm the identity of a network device before granting network connectivity. This can be done as follows. Each piece of EDP equipment that is to be moved can be configured with a unique device ID (DID). This can be done in a number of ways. In a preferred method, the identity of the device is set (or reset) the first time the device is connected to the network. The set of known DID's can be part of the network "map," and the network information equivalent to that for each IPID can also be associated with each DID in the "map." Existing methods to set the DID such that it is secure and verifiable can be adapted (802.1x, for example) or purpose built application protocols can be created for this function. After the distribution strip, port modules and individual ports have been configured, but before network connectivity is enabled, each active network port (each with a network device plugged in and powered up, which can usually be sensed by the port at the link layer) queries the connected device for its DID and then sends that DID to the distribution strip, which sends it on to the NCM. The NCM then compares the DID to a list of approved local network or remote network DIDs (which can be extracted from "maps" from remote network NCMs) and selectively allows the desired network connectivity (full, limited or none) in conformance with the defined connectivity policy. The DID can be verified by the NCM prior to granting any network connectivity as part of the process. If the device has no prior defined DID, the NCM assigns one in accordance with default policies (which could make decisions based on all available information) or request operator intervention to decide what to do. The DID is then added to the "map," updates are done, and the DID is stored on the device.

As will be appreciated, this invention allows electronic data processing (EDP) equipment to be moved in the data center or between data centers without requiring the services of a network technician to move the network identity of a specific piece of equipment being moved to a different location or reconfigure the network to function. It will be appreciated that although the preferred embodiment of the network is to use the vertical form-factor network distribution strips with the port modules, other form factors, such as traditional rack mounted network switches, could also be designed to accept the modules and function in exactly the same manner as the vertical network distribution strips.

Another embodiment of the invention is as follows. A vertical form-factor network distribution strip or conventional rack mounted network device with integrated or modular (but lacking the features of the port modules described above) network ports can be used to enable EDP equipment moves between network ports in a similar manner to the method described previously as follows. Each piece of EDP equipment that is connected to the network can be configured with a secure and verifiable unique device ID (DID) as was described earlier. A current copy of the "map" (or a subset of the "map" with only the information and policies specific to that device) can be placed on each EDP device that is configured with a DID. This can be stored in firmware or on a suitable storage device, such as a hard disk drive, depending on the type of EDP equipment and its component options. When an EDP device is moved in the network, the same basic method is used to move the network identity of that device to a new port. This is done as follows.

The EDP device is plugged in and transmits it's DID and copy of the "map" to the network device. The network device forwards all of this information to the NCM. The NCM can then verify the DID before proceeding further. The NCM takes the digital signature of the "map" from the EDP device and compares it to the digital signature of its current copy of the "map" to see if they match. If they don't the NCM will then compare the digital signature it received to a list of approved "maps" and look for a match. These approved "maps" are other networks managed by other NCMs that have a connection policy defined in the local NCM that direct how to treat EDP devices coming from those networks. The NCM will then look up the DID of the EDP device in the local or remote network "maps" and determine if the EDP device is already approved for connection. If so, it will direct the network device to grant and implement the network connectivity in accordance with the defined connectivity policy. This can include creation and routing of new network entities (such as VLANs), remapping of network entities (such as VLANs) to new addresses, and preserving or reassigning host addresses. The function that happens is that the desired connectivity between the new EDP device and the network (and any networks that it can reach) is established in accordance with the connectivity policy. All other actions that may need to be taken to implement the policy such as directed assignment and communication of a specific host address to the EDP device and/or directed assignment and communication of other network information needed to establish the desired network connectivity such as subnet mask, default gateway, etc., will also be done. It should be noted that for EDP devices with multiple network ports, this sequence of events will be repeated each time a network port is plugged in or moved.

It can be appreciated that this last method allows the retrofitting of existing network devices via the addition of the needed features to their operating systems to support the movement of connected EDP devices as directed by the NCM.

An additional feature that can be added is to support the movement of network addresses in the manner just described. This is useful for supporting the relocation of virtualized operating system instances between two different EDP devices. This can be done by triggering the same sequence of events that occur when an EDP device is plugged into the network. As can be appreciated this may include supporting multiple network addresses on one network port as is commonly done now. The trigger event can be the appearance of a new network address on an already connected network port or other suitable event.

The foregoing description of the present invention has been presented for purposes of illustration and description. Furthermore, the description is not intended to limit the invention to the form disclosed herein. Consequently, variations and modifications commensurate with the above teachings, and skill and knowledge of the relevant art, are within the scope of the present invention. The embodiments described hereinabove are further intended to explain best modes known of practicing the invention and to enable others skilled in the art to utilize the invention in such, or other embodiments and with various modifications required by the particular application(s) or use(s) of the present invention. It is intended that the appended claims be construed to include alternative embodiments to the extent permitted by the prior art.

What is claimed:

1. An apparatus for use in connecting rack-mounted data devices to a data network, said apparatus comprising:
 a distribution strip having a longitudinal axis, said distribution strip being disposed on a rack such that a length of said distribution strip, defined relative to said longitudinal axis, extends primarily or exclusively along a vertical height axis of said rack;
 a plurality of network port modules, each adapted to be inserted and removed from a module receptacle of said distribution strip wherein said module receptacles are spatially distributed relative to said longitudinal axis of said distribution strip, each said module including one or more network ports for connecting one of said rack-mounted data devices to said network, each said module receptacle including a port connector that mates with a module connector of the module for establishing connectivity to the module, wherein a first network port of a first network port module of said plurality of network port modules is a first type of network port associated with a first type of industry networking standard and a second network port of a second network port module of said plurality of network port modules is a second type of network port, different than said first type, associated with a second type of industry networking standard, and each of said first and second network ports is operative for connecting to a cord extending between one of said rack-mounted network devices and said distribution strip; and
 wherein each module of said modules includes a data storage device configured for identifying one of said module and an associated data device.

2. The apparatus as set forth in claim 1, wherein said distribution strip is disposed in a vertical orientation on said rack.

3. The apparatus as set forth in claim 1, wherein said distribution strip is incorporated into said rack.

4. The apparatus as set forth in claim 1, further comprising a plurality of patch cords for connecting said rack-mounted data devices to said network ports, wherein a majority of said patch cords have lengths that are equal to or less than one-half said height of said rack.

5. The apparatus as set forth in claim 1, further comprising a plurality of patch cords for connecting said rack-mounted data devices to said network ports, wherein a majority of said patch cords have lengths that are equal to or less than said width of said rack.

6. The apparatus as set forth in claim 1, wherein each distribution strip includes a data network switch device to enable selective communication with said rack-mounted data devices via said ports.

7. The apparatus as set forth in claim 1, wherein said distribution strip includes logic structure for executed network connectivity logic with respect to said rack-mounted data devices via said ports.

8. The apparatus as set forth in claim 1, wherein said distribution strip includes a fiber port or a copper port for connecting said strip to the data network.

9. The apparatus as set forth in claim 1, wherein said distribution strip includes at least two fiber or copper ports for use in connecting said distribution strip to said network.

10. The apparatus as set forth in claim 1, wherein said distribution strip does not occupy any equipment space within a rack.

11. The apparatus as set forth in claim 1, wherein said plurality of network ports includes GBIC, Fibre Channel, Copper Ethernet, USB, or custom proprietary ports.

12. The apparatus as set forth in claim 1, further comprising a network indication device, associated with one or more of said network ports, for providing an indication of a network association or any other information regarding each of said one or more network ports.

13. The apparatus as set for thin claim 12, wherein said network indication device includes an LCD device.

14. The apparatus as set forth in claim 12, wherein said network indication device includes an LED, LCD or other display.

15. The apparatus as set forth in claim 1, further comprising:
 a protocol gateway embodied on said distribution strip, that is operable to receive communication information from multiple data transfer protocols and communicate said information over said network using a gateway transfer protocol that is different from at least one of said multiple data transfer protocols; and
 a plurality of protocol gateway ports, disposed on said distribution strip, for connecting said rack-mounted data devices to said network, wherein each of said rack-mounted data devices communicates with said protocol gateway through at least one of said multiple data transfer protocols.

16. The apparatus as set forth in claim 15, wherein said multiple data transfer protocols include at least two of RS-232 serial, USB, Ethernet, and Fibre Channel.

17. The apparatus as set forth in claim 15, wherein said first data communication protocol is one of RS-232 serial, USB, Ethernet, Fibre Channel and raw data free from IP, TCP or other data framing and said second data transfer protocol is TCP/IP.

18. A method for use in connecting rack-mounted data devices to a network, the method comprising:
 providing a distribution strip with a plurality of network port modules distributed along a vertical axis of a rack, each said network port module adapted to be inserted and removed from one of a plurality of module receptacles of said distribution strip and including one or more network ports for use in connecting one or more of said rack-mounted data devices to said network, wherein said module receptacles are spatially distributed relative to said vertical axis of said rack, each said module receptacle including a port connector that mates with a module connector of the module for establishing connectivity to the module, wherein a first network port of a first network port module of said plurality of network port modules is a first type of network port associated with a first type of industry networking standard and a second network port of a second network port module of said plurality of network port modules is a second type of network port, different than said first type, associated with a second type of industry networking standard and each of said first and second network ports is operative for connecting to a cord extending between one of said rack-mounted network devices and said distribution strip; and connecting each of multiple data devices in said rack to a substantially vertically adjacent one of said network ports using, in each case, a cord that connects a respective one of said data devices to a respective one of said network ports.

19. A system for connecting rack-mounted data devices to a data network, the system comprising:
a first distribution strip associated with a first subset of a set of data devices, wherein said set of data devices are mounted in multiple racks;
a second distribution strip associated with a second subset of said set of data devices; and
for each of said first and second distribution strips, first and second separate data connections to said data network including one or more network devices, said one or more network devices being separate from said set of data devices mounted in said multiple racks, said first and second separate data connections providing Redundant data pathways for communication between, on the one hand, each of said first and second distribution strips and, on the other hand, said network including said one or more network devices.

20. The system as set forth in claim 19, wherein said first subset of said set of data devices is mounted in a first rack and said second subset of said set of data devices is mounted in a second rack.

21. The system as set forth in claim 19, wherein, for each of said first and second distribution strips, said first and second data connections extend directly from said first or second distribution strip to a network device.

22. The system as set forth in claim 19, wherein said first and second distribution strips are connected in series in a loop to provide said first and second connections.

23. A system for connecting rack-mounted data devices to a data network, comprising:
a first distribution strip associated with a first subset of a set of data devices, wherein said set of data devices are mounted in multiple racks; and
first and second separate data connections for connecting said first distribution strip to said network including one or more network devices, said one or more network devices being separate from said set of data devices mounted in said multiple racks, said first and second separate data connections providing Redundant data pathways for communication between said first distribution strip and said network including said one or more network devices.

24. A method for use in connecting rack-mounted data devices to a network, comprising:
physically connecting multiple data devices to a distribution strip by connecting each cord of a plurality of cords to one of said multiple data devices and to said distribution strip; and
physically connecting said distribution strip to a network device via a first connection pathway and by a second connection pathway separate from said first connection pathway, said first and second communication pathways providing Redundant data pathways for communication between each of said multiple data devices and said network device.

* * * * *